(12) United States Patent
Rao et al.

(10) Patent No.: US 8,278,711 B2
(45) Date of Patent: Oct. 2, 2012

(54) SEMICONDUCTOR DEVICE AND METHOD OF MAKING THE SAME

(75) Inventors: Ramakrishna Rao, Bangalore (IN); Stephen Daley Arthur, Glenville, NY (US); Peter Almern Losee, Clifton Park, NY (US); Kevin Dean Matocha, Rexford, NY (US)

(73) Assignee: General Electric Company, Niskayuna, NY (US)

( * ) Notice: Subject to any disclaimer, the term of this patent is extended or adjusted under 35 U.S.C. 154(b) by 127 days.

(21) Appl. No.: 12/952,418

(22) Filed: Nov. 23, 2010

(65) Prior Publication Data

US 2012/0126321 A1 May 24, 2012

(51) Int. Cl.
*H01L 29/66* (2006.01)

(52) U.S. Cl. .. 257/339; 438/268; 438/519; 257/E29.012

(58) Field of Classification Search .................. 257/339, 257/E29.012; 438/268, 519
See application file for complete search history.

(56) References Cited

U.S. PATENT DOCUMENTS

| | | | |
|---|---|---|---|
| 4,648,174 A | 3/1987 | Temple et al. | |
| 5,801,836 A | 9/1998 | Bakowski et al. | |
| 7,615,802 B2 | 11/2009 | Elpelt et al. | |
| 7,919,824 B2 * | 4/2011 | Ono et al. | 257/401 |
| 2006/0172543 A1 | 8/2006 | Merrett et al. | |
| 2010/0055882 A1 | 3/2010 | Imhoff et al. | |
| 2010/0289032 A1 * | 11/2010 | Zhang et al. | 257/77 |
| 2011/0140197 A1 * | 6/2011 | Tomita et al. | 257/330 |

OTHER PUBLICATIONS

Trost et al., "The Effect of Charge in Junction Termination Extension Passivation Dielectrics", IEEE, pp. 189-192, 1999.
Stengl et al., "Variation of Lateral Doping—A New Concept to Avoid High Voltage Breakdown of Planar Junctions", IEDM, pp. 154-157, Dec. 1985.
Temple et al., "Junction Termination Extension for Near-Ideal Breakdown Voltage in p-n Junctions", IEEE Transactions on Electron Devices, vol. ED-33, No. 10, pp. 1601-1608, Oct. 1986.

* cited by examiner

*Primary Examiner* — Trung Q Dang
(74) *Attorney, Agent, or Firm* — Penny A. Clarke (57) ABSTRACT

A substrate having semiconductor material and a surface that supports a gate electrode and defines a surface normal direction is provided. The substrate can include a drift region including a first dopant type. A well region can be disposed adjacent to the drift region and proximal to the surface, and can include a second dopant type. A termination extension region can be disposed adjacent to the well region and extend away from the gate electrode, and can have an effective concentration of second dopant type that is generally less than that in the well region. An adjust region can be disposed between the surface and at least part of the termination extension region. An effective concentration of second dopant type may generally decrease when moving from the termination extension region into the adjust region along the surface normal direction.

20 Claims, 13 Drawing Sheets

SEMICONDUCTOR DEVICE AND METHOD OF MAKING THE SAME

BACKGROUND

Embodiments presented herein relate to semiconductor devices and methods for fabricating the same and, more particularly, to semiconductor devices in which a junction termination extension region is utilized.

Breakdown voltage of the reverse-blocking junction typically serves to limit the maximum reverse voltage that a semiconductor device formed with a p-n junction can withstand. Such a blocking junction may comprise, for example, a p-n junction of a thyristor, a bipolar transistor, an insulated-gate transistor, or a corresponding junction in a metal-oxide-semiconductor field-effect transistor (MOSFET). Avalanche breakdown occurs in such a device at a voltage substantially less than the ideal breakdown voltage because excessively high electric fields are present at certain locations ("high field points") in the device under reverse bias. A high field point of a blocking junction under reverse bias usually occurs slightly above the metallurgical junction along a region of curvature, such as that at the end of the junction.

Conventional semiconductor devices may utilise any of various structures and methods to achieve an increase in the breakdown voltage of a p-n junction. For example, junction termination extension (JTE) regions are utilized near terminated portions of the p-n junction. In general, a JTE region may be considered as a more lightly doped extension of a heavily doped semiconductor region that adjoins a lightly doped semiconductor region to form the foregoing p-n junction. The principal function of the JTE region is to reduce the high concentration of electric fields that would otherwise exist in the vicinity of the terminated portion of the p-n junction, and especially at the high field points, by laterally extending the blocking junction.

BRIEF DESCRIPTION

In one aspect, a device, such as a metal-oxide semiconductor field effect transistor, is provided. The device can include a substrate that includes semiconductor material and has a surface, which surface supports a gate electrode and defines a surface normal direction. An insulation layer may be disposed between the gate electrode and the substrate.

The substrate can include a drift region including a first dopant type so as to have a first conductivity type. The substrate can include a well region that is disposed adjacent to the drift region and proximal to the surface, the well region including a second dopant type so as to have a second conductivity type. The well region can also include a channel region disposed proximal to the gate electrode.

The substrate can further include a termination extension region disposed adjacent (e.g., transversely adjacent) to the well region and extending away from the gate electrode. The termination extension region can have an effective concentration of second dopant type that is generally less than that in the well region. In some embodiments, the termination extension region may include a plurality of discrete regions having the second conductivity type.

The substrate can further include an adjust region disposed adjacent to the surface and between the surface and at least part of the termination extension region. In some embodiments, the termination extension region may substantially surround the adjust region. Where the termination extension region is disposed transversely adjacent to the well region, the adjust region may be proximal to a transverse edge of the termination extension region. An effective concentration of second dopant type may generally decrease when moving from the termination extension region into the adjust region along the surface normal direction.

The substrate may further include a contact region that has the first conductivity type. The well region can be disposed adjacent to the contact region, such that the channel region and the termination extension region are disposed on opposing sides of the contact region. A source electrode in contact with said contact region and a drain electrode in contact with a second surface of said substrate.

In another aspect, a method is provided, such as a method for fabricating a MOSFET. The method can include providing a substrate including semiconductor material doped with a first dopant type to have a first conductivity type. The provided substrate can also have a surface that defines a surface normal direction. The substrate can be doped with a second dopant type to form a well region proximal to the surface and having a second conductivity type.

The substrate can be doped to form a termination extension region adjacent to the well region. The termination extension region can be doped to have an effective concentration of second dopant type that is generally less than that in the well region. In some embodiments, the substrate can be doped such that the termination extension region includes a plurality of discrete regions of the substrate. In some embodiments, the substrate can be doped to form a termination extension region that is transversely adjacent to the well region and an adjust region that is proximal to a transverse edge of the termination extension region.

The substrate can be doped (e.g., with the first dopant type) to form an adjust region disposed adjacent to the surface and between the surface and at least part of the termination extension region, wherein an effective concentration of second dopant type generally decreases when moving from the termination extension region into the adjust region along the surface normal direction. In some embodiments, doping the substrate to form the termination extension region can include doping a termination-adjust region of the substrate, and the termination-adjust region can be doped to form therein the adjust region. In some embodiments, doping the well region can include doping a well-termination region of the substrate, and doping the termination extension region can include doping part of the well-termination region to form therein the termination region.

In some embodiments, a gate electrode can be formed so as to be supported by the substrate surface, such that the well region extends proximal to the gate electrode and the termination extension region extends away from the gate electrode. In some embodiments, an insulation layer can be formed on the substrate, and the gate electrode can be formed on the insulation layer.

The substrate can be doped to form a contact region that has the first conductivity type and is disposed adjacent to the well region. A source electrode can be formed in contact with the contact region, and a drain electrode can be formed in contact with a second surface of the substrate.

In another aspect, a device fabricated according to the above described method is provided.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Example embodiments are described below in detail with reference to the accompanying drawings, where the same reference numerals denote the same parts throughout the drawings. Some of these embodiments may address the above and other needs.

Figure 1:
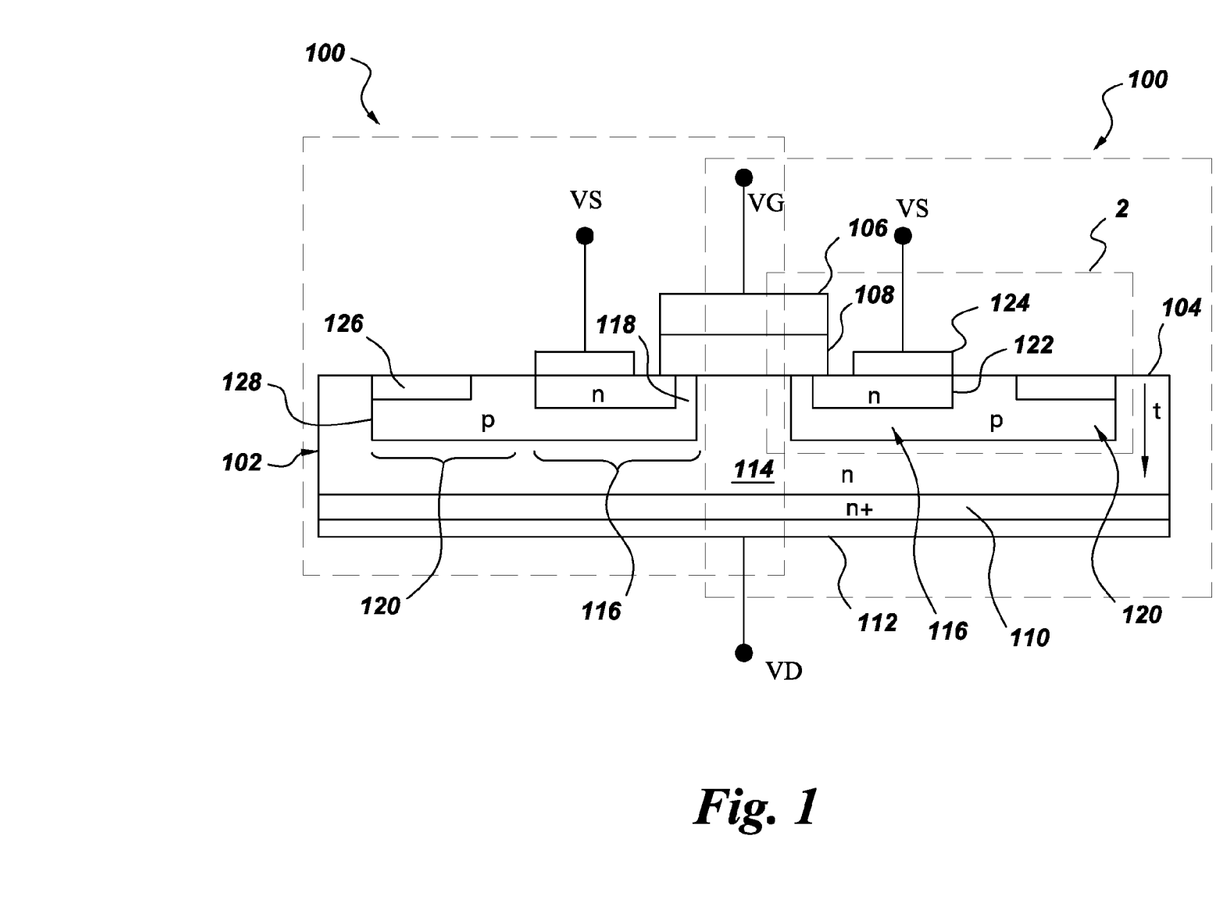
FIG. 1 is a cross-sectional view of a MOSFET configured in accordance with an example embodiment.

Referring to FIG. 1, therein is shown a device, such as a MOSFET 100 configured in accordance with an example embodiment. The MOSFET 100 can include a substrate 102 that includes semiconductor material, such as, for example, silicon carbide. The substrate 102 may be a semiconductor die or wafer that defines a major surface 104 and a surface normal direction or "thickness direction" t that extends normally from the surface and into the substrate, as well as directions transverse to the thickness direction (parallel to the local surface). The surface 104 can support a gate electrode 106. For example, the gate electrode 106 may be disposed on an insulation layer 108 that is in direct contact with the surface 104, such that the insulation layer is disposed between the gate electrode and the substrate 102. The gate electrode 106 may include electrically conductive material, such as metal, and may be configured to receive a gate voltage VG. The insulation layer 108 may include electrically insulating material, such as silicon dioxide. The substrate 102 can also define a second surface 110 that is in contact with a drain electrode 112, which drain electrode can be configured to receive a drain voltage VD. It is noted that FIG. 1 includes a pair of MOSFETs that are situated next to one another and share a common gate electrode 106 and drain electrode 112.

The substrate 102 can include a drift region 114 and, adjacent thereto and proximal to the surface 104, a well region 116. The drift region 114 can be doped with a first dopant type so as to have a first conductivity type with first majority charge carriers and the well region 116 can be doped with a second dopant type so as to have a second conductivity type with second majority charge carriers. For example, the first and second majority charge carriers can be electrons and holes, respectively, such that the respective first and second conductivity types are n-type and p-type, as shown in FIG. 1; where the substrate is formed of silicon carbide, the first dopant type can be, for example, one or more of nitrogen and phosphorus ("n-type dopants"), and the second dopant type can be, for example, one or more of aluminum, boron, gallium, and beryllium ("p-type dopants"). The well region 116 can include a channel region 118 disposed proximal to the gate electrode. For example, the channel region 118 may extend along the surface 104 under the gate electrode 106 (where "under" means along the thickness direction t).

A termination extension region 120 can be disposed adjacent to the well region 116. The termination extension region 120, discussed further below, can extend away from the gate electrode 106, for example, laterally to the thickness direction t, such that the termination extension region is disposed transversely adjacent to the well region 116. The substrate 102 can further include a contact region 122 that has the first conductivity type (n-type in the figure). The well region 116 can be disposed adjacent to the contact region 122 such that the channel region 118 and the termination extension region 120 are disposed on opposing sides of the contact region. In one embodiment, the contact region 122 can be disposed adjacent to the surface 104 and the well region 116 can radially surround the contact region. A source electrode 124 can be disposed in contact with the contact region 122, and the source electrode can be configured to receive a source voltage VS.

Figure 2:
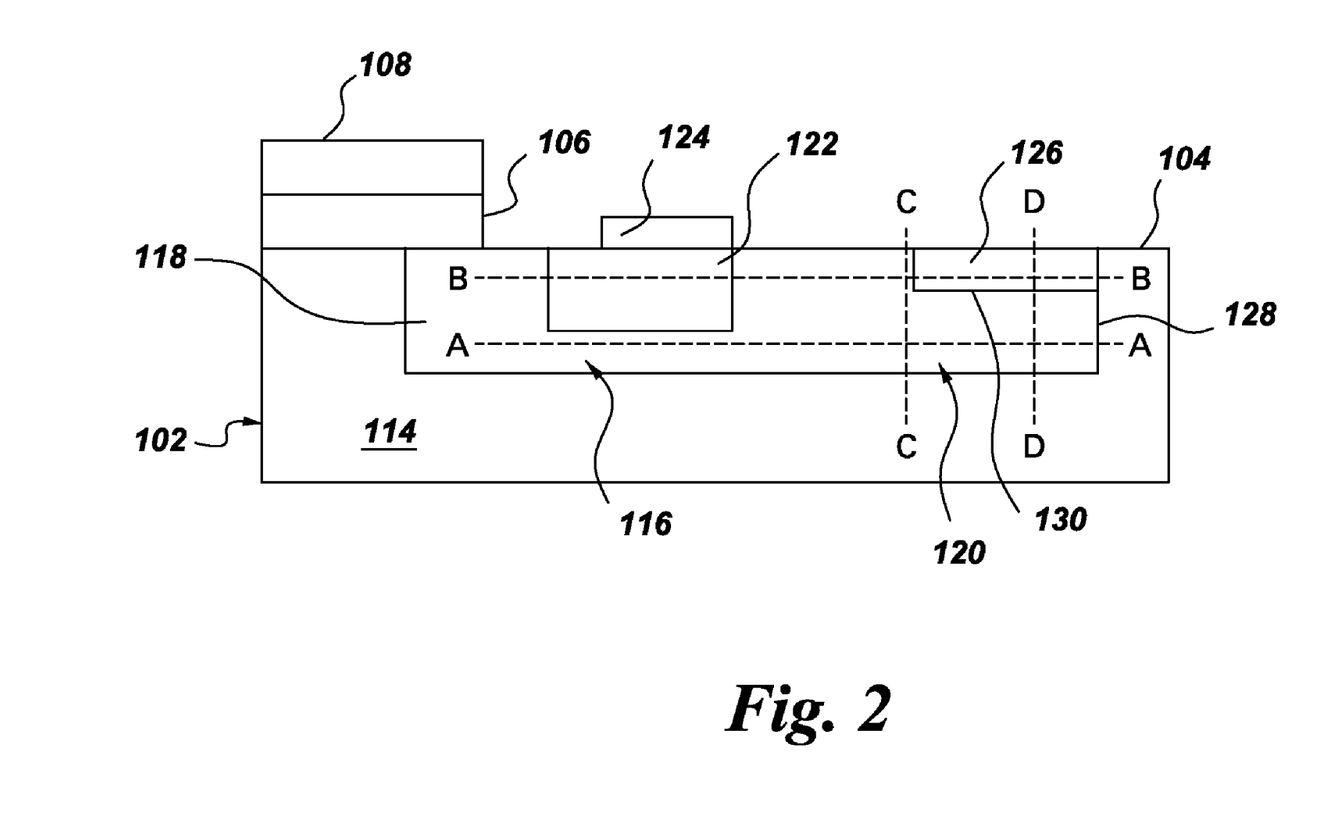
FIG. 2 is a magnified cross-sectional view of the MOSFET of FIG. 1.
Figure 3:
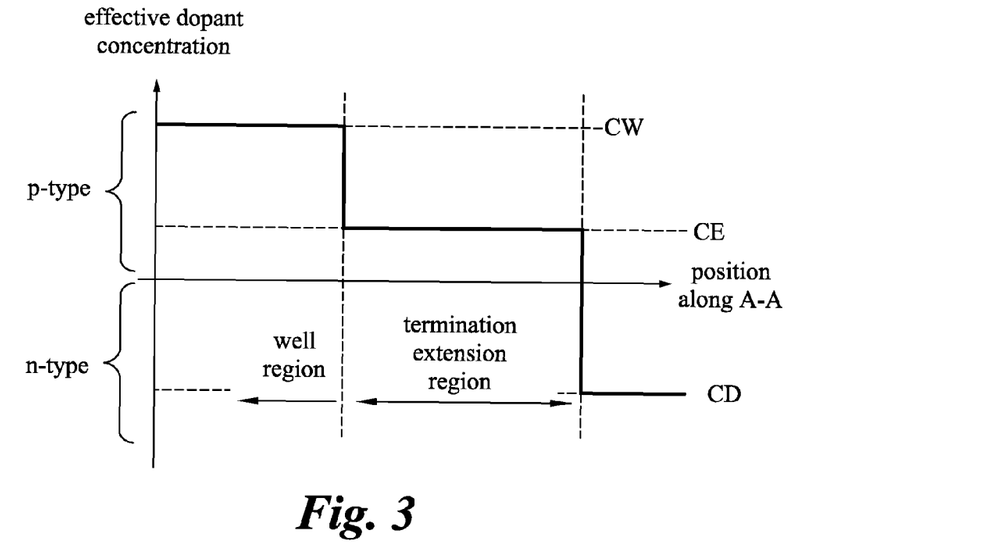
FIG. 3 is a plot of effective dopant concentration as a function of position along the line A-A of FIG. 2 for an example embodiment.

Referring to FIGS. 2 and 3, the termination extension region 120 can have an effective dopant concentration of second dopant type that is generally less than that in the well region 116. For example, the substrate 102 can be formed of silicon carbide and generally doped with, say, nitrogen (i.e., in this case, the "first dopant type" is n-type), such that the drift region 114 has n-type conductivity and an effective n-type dopant concentration of CD. The well region 116 can be doped with, say, aluminum, such that the well region has p-type conductivity and have an effective p-type dopant concentration of CW. The termination extension region 120 can also be doped p-type, but with an effective dopant concentration CE that is less than CW.

It is noted that the "effective" dopant concentration of a region refers to the difference between the concentrations of atoms of first and second dopant types in that region. For example, in the above-described embodiment, the substrate 102 may include everywhere an n-type dopant concentration of CD. The well region 116 may have an effective p-type dopant concentration of CW, which concentration can be obtained by assuring that the well region includes an overall concentration of p-type dopant atoms of CW+CD ("effective" concentration being equal to [CW+CD]−CD). The "effective" concentration of charge carriers can be similarly understood.

Figure 4:
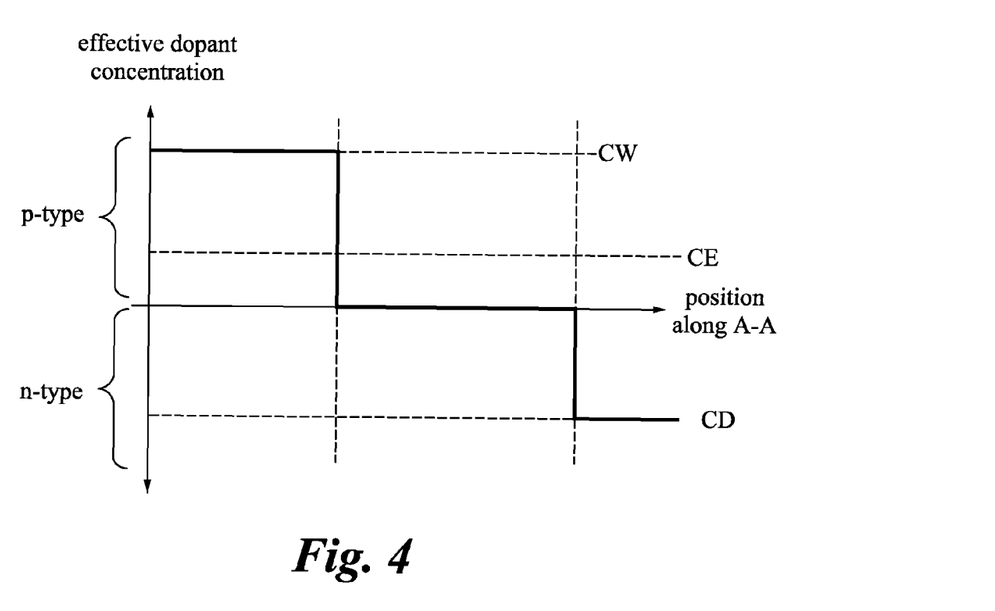
FIG. 4 is a plot of effective dopant concentration as a function of position along the line A-A of FIG. 2 for another example embodiment.
Figure 5:
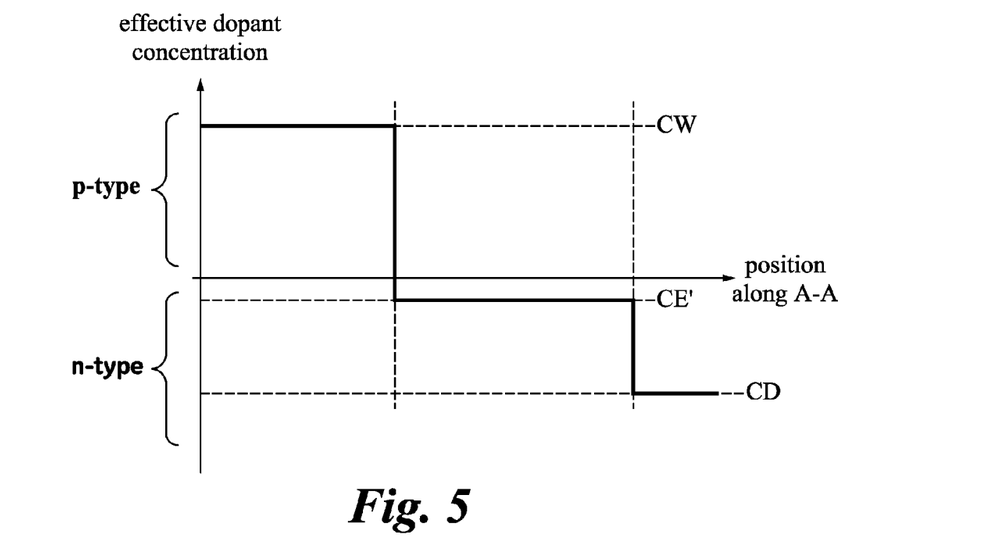
FIG. 5 is a plot of effective dopant concentration as a function of position along the line A-A of FIG. 2 for yet another example embodiment.
Figure 6:
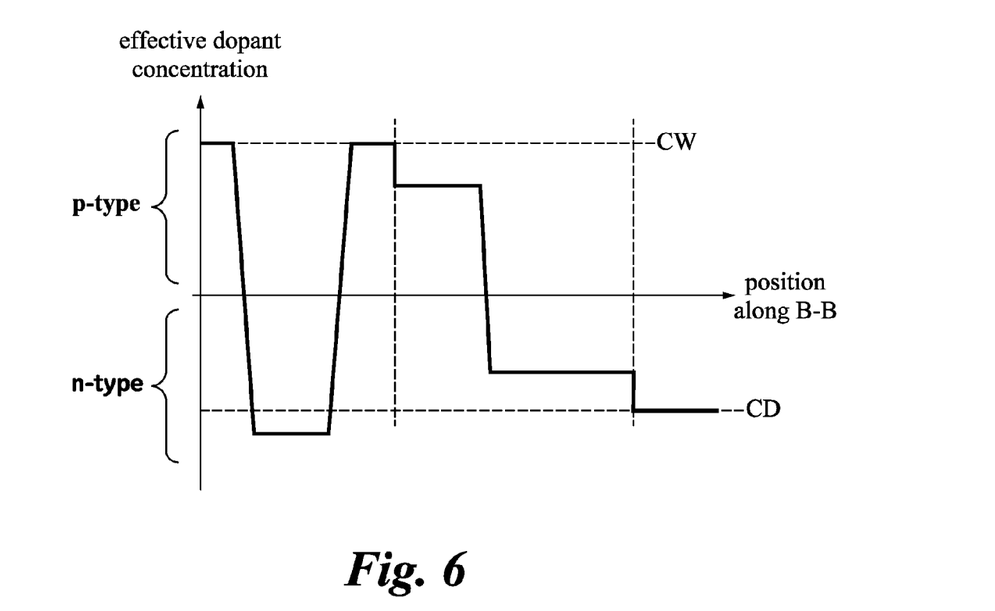
FIG. 6 is a plot of effective dopant concentration as a function of position along the line B-B of FIG. 2 for the example embodiment of FIG. 3.
Figure 7:
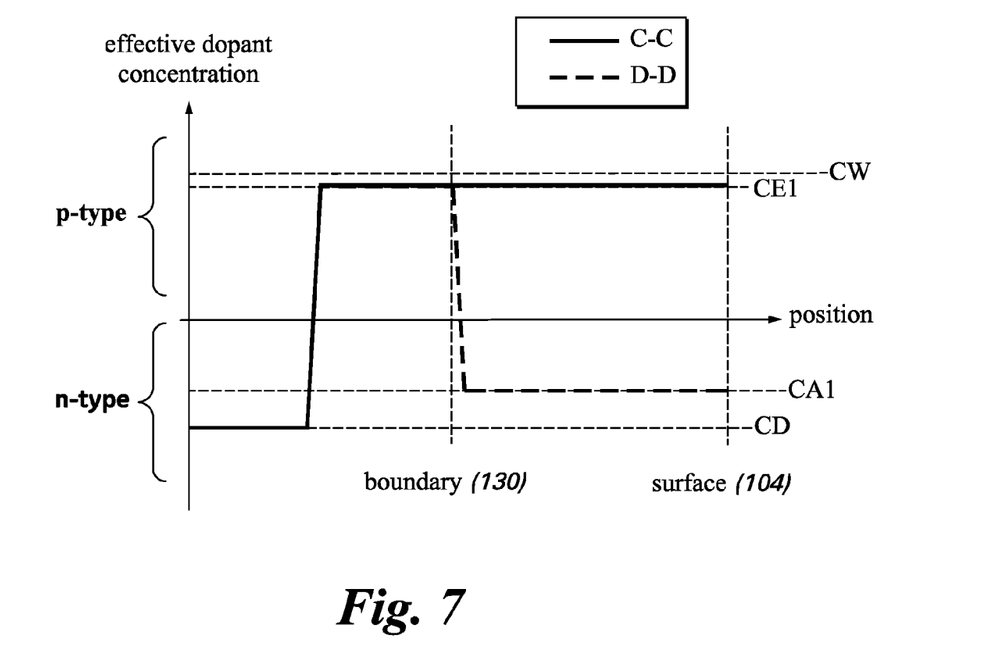
FIG. 7 is a plot of effective dopant concentration as a function of position along the lines C-C and D-D of FIG. 2 for the example embodiment of FIG. 3.
Figure 8:
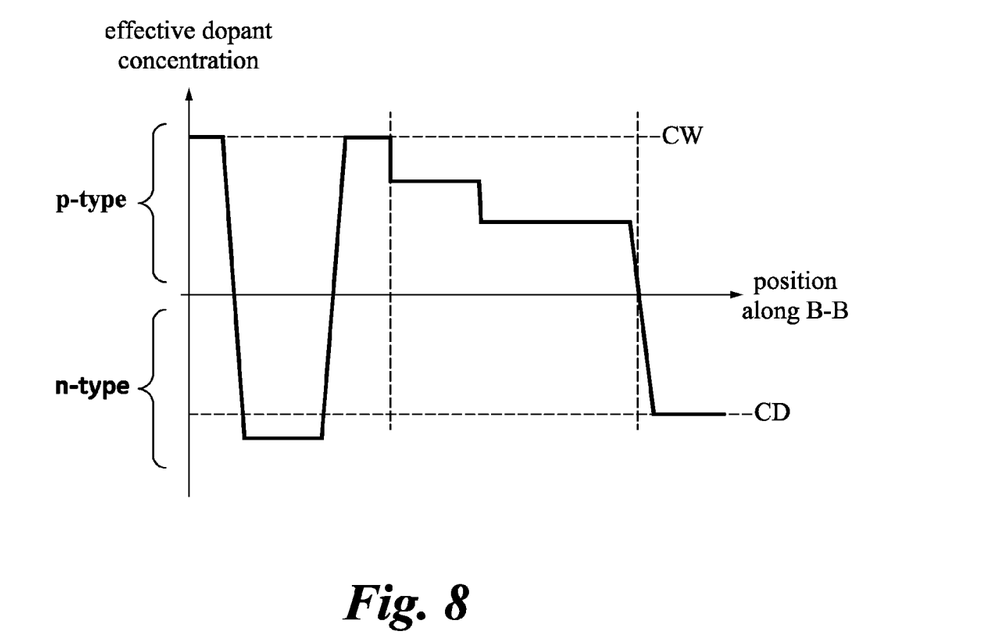
FIG. 8 is a plot of effective dopant concentration as a function of position along the line B-B of FIG. 2 for another example embodiment of FIG. 4.
Figure 9:
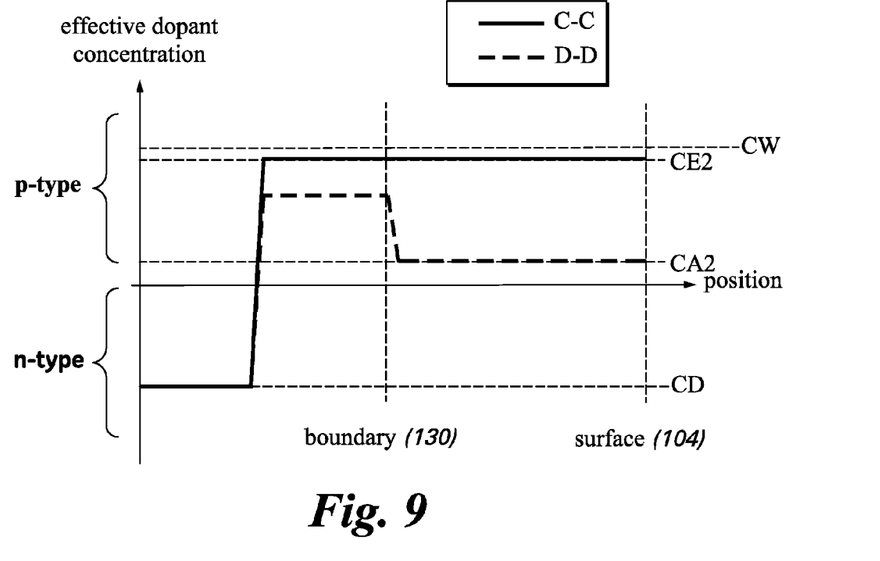
FIG. 9 is a plot of effective dopant concentration as a function of position along the lines C-C and D-D of FIG. 2 for the example embodiment of FIG. 4.

It is also noted that other effective dopant concentrations are also possible for the termination extension region 120. For example, referring to FIGS. 1, 2, and 4, the termination extension region 120 can be doped so as to have an effective dopant concentration that of roughly zero. Referring to FIG. 5, in another embodiment, the termination extension region 120 can be doped so as to have an effective dopant concentration CE' that is n-type. In some embodiments, the effective dopant concentration may be non-uniform (e.g., as described in R. Stengl et al., "Variation of Lateral Doping-A New Concept to Avoid High Voltage Breakdown of Planar Junctions," IEDM, December 1985, pp. 154-157, the content of which is incorporated herein by reference in its entirety) within the termination extension region 120.

Referring to FIGS. 1, 2, 6, and 7, an adjust region 126 can be disposed adjacent to the surface 104 and between the surface and at least part of the termination extension region 120. For example, the adjust region 126 can be disposed immediately adjacent to both the surface 104 and the termination extension region 120, such that the adjust region is disposed essentially within the termination extension region (i.e., the termination extension region more or less surrounds the adjust region, as shown in FIG. 1). The adjust region 126 may be disposed proximal to a (possibly diffuse) transverse edge 128 of the termination extension region 120 (e.g., sharing or overlapping a boundary with the termination extension region).

An effective concentration of second dopant type (p-type, if keeping with the above examples) may generally decrease when moving from the termination extension region 120 into the adjust region 126 along the thickness direction t. For example, a (possibly diffuse) boundary 130 may exist between the termination extension region 120 and the adjust region 126. The effective dopant concentration as measured when moving along the thickness direction t from the termination extension region 120 into and through the adjust region 126 (e.g., along line D-D in FIG. 2) can decrease in the vicinity of the boundary 130, such that the concentration on the termination extension region side of the boundary is higher (say, CE1) than the concentration on the adjust region side (say, CA1). Alternatively, the effective dopant concentration as measured when moving along the thickness direction t through the termination extension region 120 but away from the adjust region 126 (e.g., along line C-C of FIG. 2) may remain fairly constant (say, at concentration CE1). In the example illustrated in FIGS. 6 and 7, the conductivity type of the substrate 102 as measured along line D-D inverts from p-type to n-type at the boundary 130, and the "effective concentration of p-type dopant" can be thought of as becoming negative after that point (that is, continuing to decrease even after the character of the underlying semiconductor material has changed from p-type to n-type).

Referring to FIGS. 1, 2, 8, and 9, in some embodiments, the effective concentration of second dopant type (again, p-type, if maintaining consistency with the above examples) may generally decrease when moving from the termination extension region 120 into the adjust region 126 along the thickness direction t, but without changing the character of the underlying semiconductor material from p-type to n-type. Rather, the effective dopant concentration may vary from a higher p-type dopant concentration CE2 on one side of the boundary 130 to a lower p-type dopant concentration CA2 on the opposing side of the boundary. In other cases, portions of the termination extension region 120 closest to the boundary 130 may be more strongly n-type than the material generally found in the drift layer 114.

Figure 10:
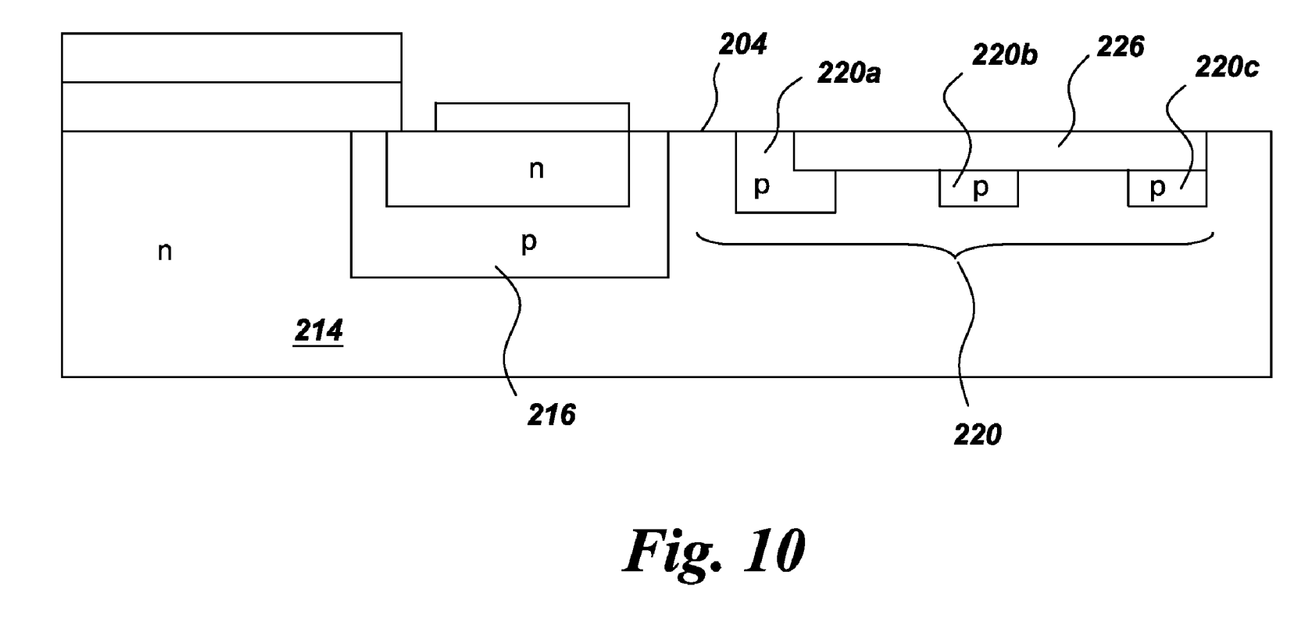
FIG. 10 is a magnified cross-sectional view of a MOSFET configured in accordance with another example embodiment.

In the above discussion, the termination extension region 120 has been represented as being a generally contiguous region within the substrate 102. However, referring to FIG. 10, in some embodiments, a termination extension region 220 can include a plurality of discrete regions 220a, 220b, 220c formed within a drift region 214 of opposite conductivity type. The discrete regions can be configured such that the average effective concentration of second dopant type is less than that in the well region 216. For example, the dopant concentration in each of the discrete regions 220a, 220b, 220c can be about the same as or lower than that in the well region 216. Overall, when the discrete regions 220a, 220b, 220c are taken together and as a whole, the termination extension region 220 can have, on average, an effective dopant concentration of second dopant type that is generally less than that in the well region 216, although the actual dopant concentration, when viewed locally, may deviate from this pattern. An adjust region 226 can be included along the surface 204 similar to the adjust region 126 of FIG. 1.

Figure 11:
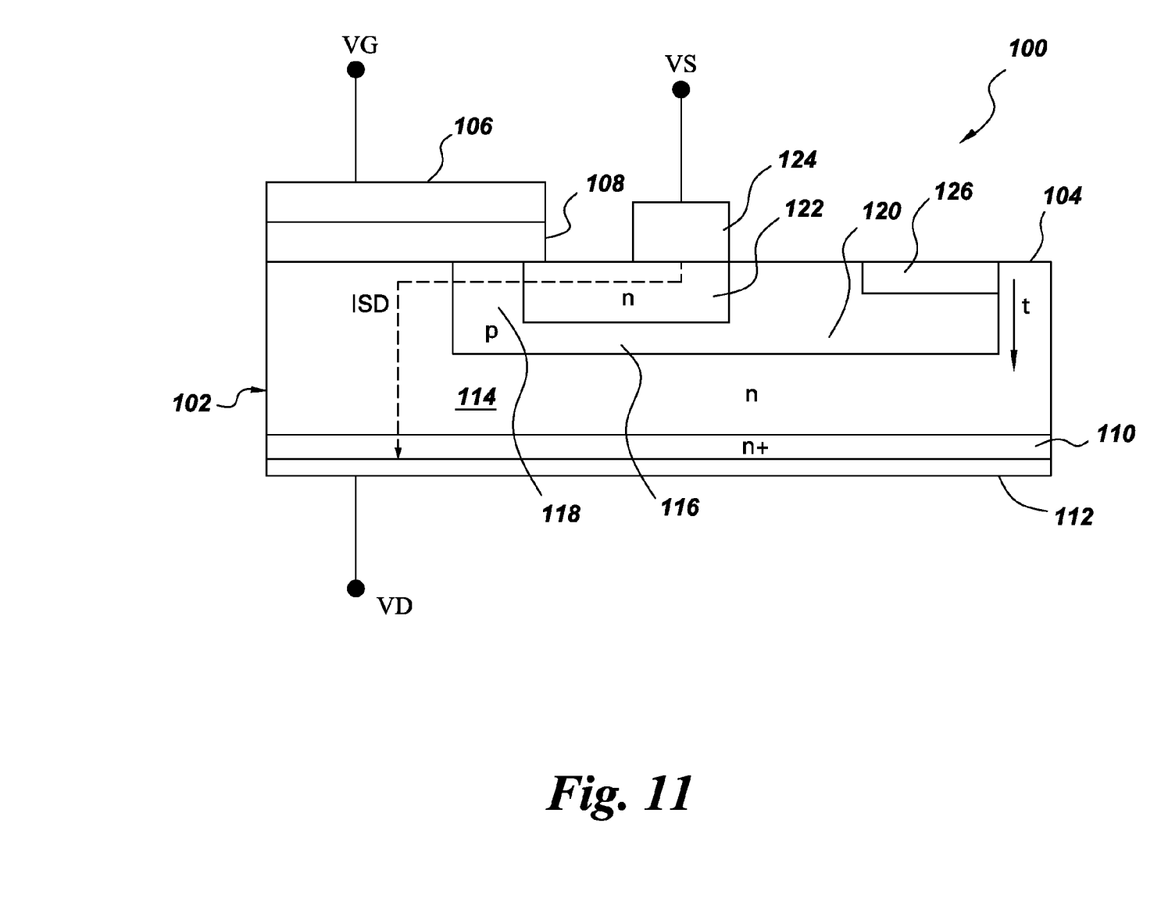
FIG. 11 is a cross-sectional view of one of the MOSFETs of FIG. 1 showing the current path between the source electrode and the drain electrode.
Figure 12:
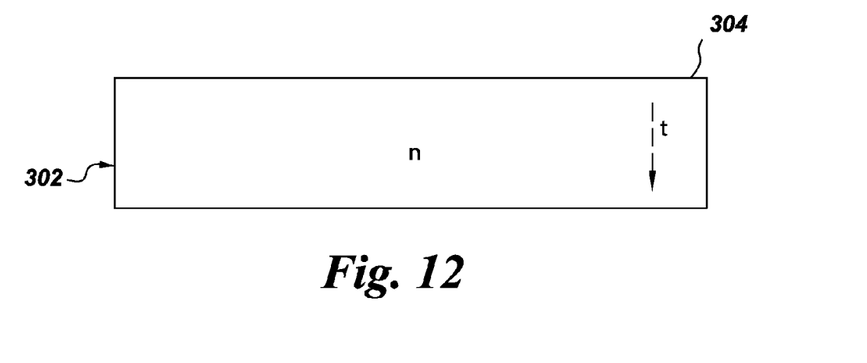
FIGS. 12-21 are cross-sectional views schematically demonstrating a method of fabricating the MOSFET of FIG. 1.

Referring to FIG. 11, in operation, the MOSFET 100 can act, for example, as a switch. When a voltage difference VSD=VS−VD is applied between the source electrode 124 and the drain electrode 112, a current ISD between those same electrodes can be modulated by a voltage VG applied to the gate electrode 106. In order for the MOSFET 100 to effectively operate as a switch, it is important that the MOSFET not pass current ISD between the source and drain electrodes 124, 112 at unintended times. However, devices that include p-n junctions (e.g., such as the MOSFET 100 of FIG. 1) are subject to breakdown under large reverse voltages (i.e., where VD>>VS). The magnitude of the voltage difference between the source voltage VS and the drain voltage VD that can be tolerated by a device before the device begins to pass unwanted currents is referred to as the "breakdown voltage." For more information on MOSFET operation and breakdown mechanisms, see Richard S. Muller and Theodore I. Kamins, *Device Electronics for Integrated Circuits, Second Edition*, John Wiley and Sons, New York, 1986, the content of which is incorporated herein by reference in its entirety.

As has been discussed previously, the maximum reverse voltage that a semiconductor device formed with a p-n junction can withstand is limited by the breakdown voltage of the reverse-blocking junction. The actual breakdown voltage of the junction normally falls short of the breakdown voltage that may ideally be achieved because excessively high electric fields are present at the end of the junction. For more information, see U.S. Pat. No. 4,927,772 to Arthur et al., which is assigned to the assignee of the present application and which is incorporated herein by reference in its entirety. Termination extension regions configured in accordance with the above description may serve to ameliorate the effects of the enhanced voltages typically expected at the ends of p-n junctions.

Applicants have discovered that including an adjust region (e.g., adjust region 126 of FIG. 1) adjacent to the surface of a MOSFET device (e.g., surface 104 of MOSFET 100 in FIG. 1) and between the device surface and a termination extension region of the device (e.g., termination extension region 120 of FIG. 1) may reduce the peak electrical fields at breakdown voltages. This, in turn, may improve the surface and bulk electric fields for the MOSFET (for a given effective dopant concentration in the junction termination region), while enabling reliable blocking voltages. Further, the presence of the adjust region may allow for a reduction in length of the junction termination region while maintaining overall performance, thus reducing the total area consumed by the device.

Figure 13:
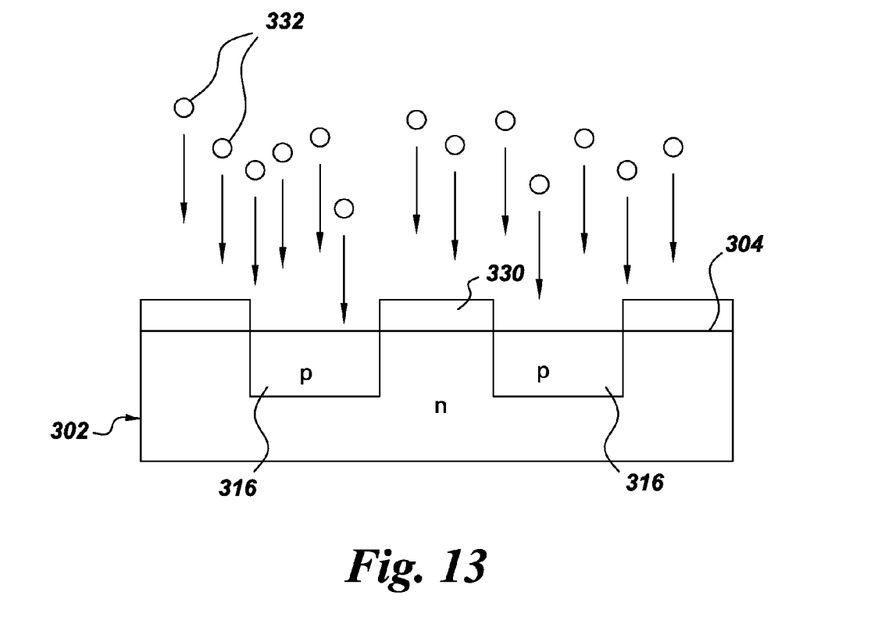

Referring to FIGS. 12-22, therein are schematically represented a method for fabricating a device, such as the MOSFET 100 of FIG. 1. The method includes providing a substrate 302 (FIG. 12), which substrate can include semiconductor material (e.g., silicon carbide) doped with a first dopant type to have a first conductivity type (say, n-type). The substrate 302 can also a surface 304 that defines a surface normal direction t. The substrate 302 can be doped with a second dopant type to form a well region 316 proximal to the surface 304 and having a second conductivity type (say, p-type). For example, a well mask layer 330 can be patterned over the surface 304 of the substrate 302, say, via photolithography, and ions 332 (e.g., aluminum, boron, gallium, and/or beryllium) can be implanted into the substrate using conventional ion implantation procedures (FIG. 13).

Figure 14:
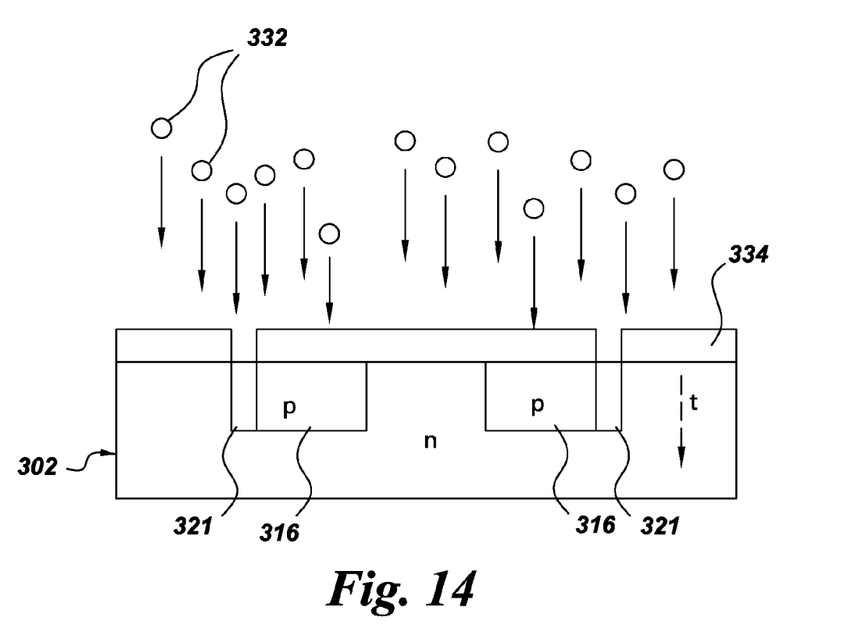
Figure 15:
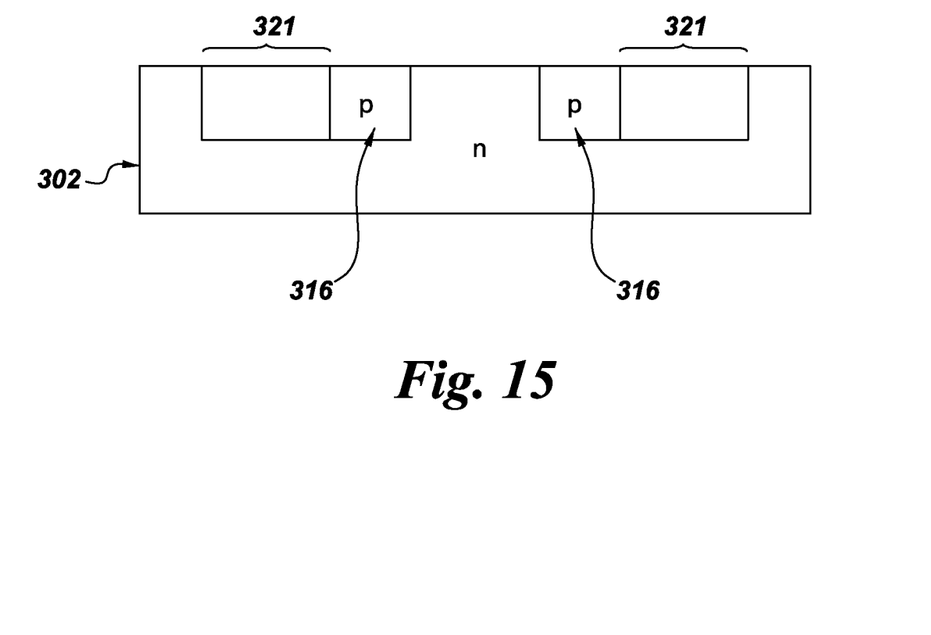

The substrate 302 can be doped to form an extended region 321 adjacent to the well region 316, the extended region being doped to have an effective concentration of second dopant type (again, p-type) that is generally less than that in the well region. For example, the extended region 321 may be doped via ion implantation. A termination extension mask layer 334 can be patterned, and doping can be performed through the mask layer to form the extended region 321 (and eventually will define the termination extension region 320)(FIG. 14). Thereafter, the termination extension mask layer 334 can be removed (FIG. 15). It is noted that the extended region 321 may be disposed within an area doped simultaneously with, and contiguous with, the well region 316. This area can be designated as the "well-termination region." As such, at least part of what is ultimately the termination extension region 320 may have earlier essentially been part of the well region 316.

Figure 16:
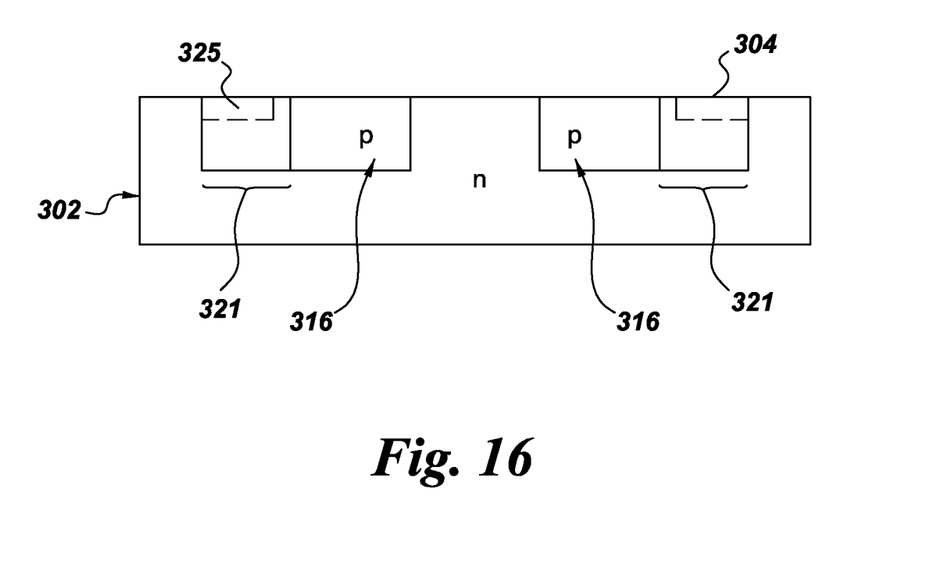
Figure 17:
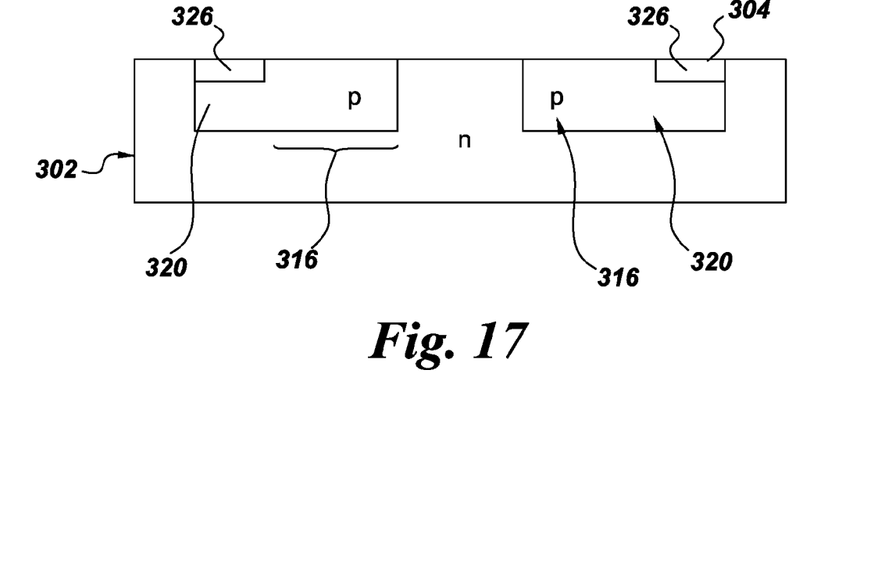

The substrate 302 can be doped, again, for example, by photolithography and ion implantation, thereby forming an adjust region 326. For example, in one embodiment, part of the extended region 321 may be designated as a termination-adjust region 325 (FIG. 16). The termination-adjust region 325 can then be implanted with n-type dopants (e.g., nitrogen and/or phosphorous) to form the adjust region 326, such that the adjust region occupies a portion of the substrate 302 that was formerly contiguous and homogeneous with the termination extension region 320 (FIG. 17). The ion implantation energy can be controlled to assure that the implanted area remains relatively close to the surface 304 compared to the depth (in the thickness direction t) of the termination extension region 320. Overall, the adjust region 326 can be disposed adjacent to the surface 304 and between the surface and at least part of the termination extension region 320. With the adjust region 226 being doped with n-type dopant superimposed over a background p-type dopant concentration, the effective concentration of p-type dopant will generally decrease when moving from the termination extension region 320 into the adjust region along the thickness direction t.

Figure 18:
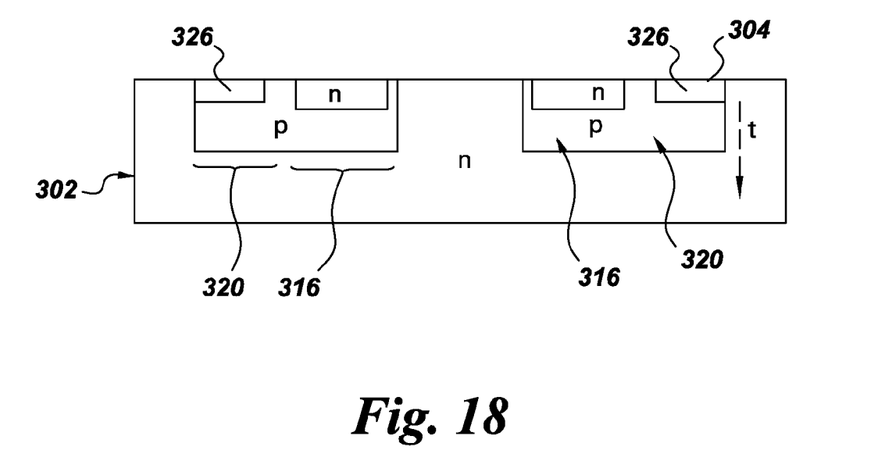
Figure 19:
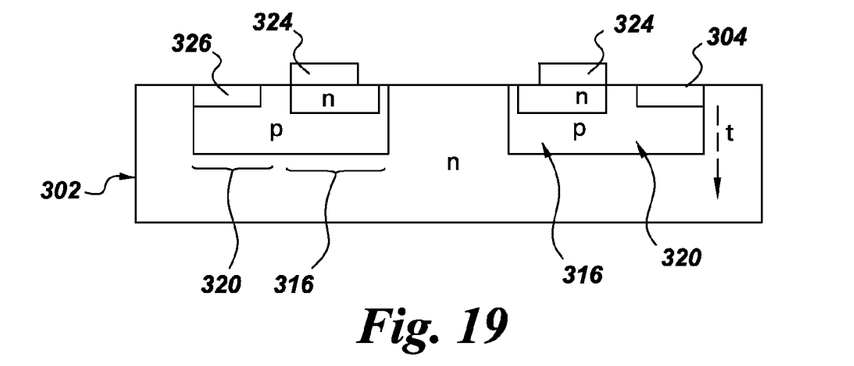
Figure 20:
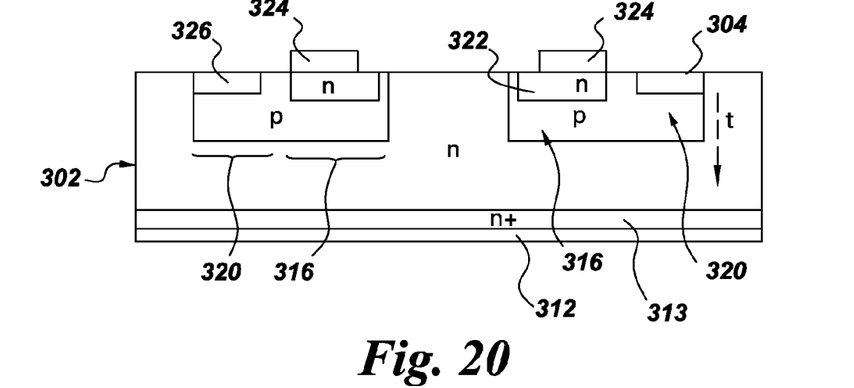

The substrate 302 can be further doped to create a contact region 322 that has the first conductivity type (here, n-type) and is disposed adjacent to the well region 316 (FIG. 18). The contact region 322 can, for example, be formed via photolithography and ion implantation, as contemplated earlier for other regions of the substrate. Thereafter, a source electrode 324 can be formed in contact with the contact region 322, for example, via vapor deposition and/or electroplating (FIG. 19). A drain electrode 312 can also be formed (e.g., via vapor deposition and/or electroplating) in contact with a second surface 310 of the substrate 302. In some cases, the substrate 302 can be doped to include a more heavily doped layer 313 that will make contact with the drain electrode 312 (FIG. 20).

Figure 21:
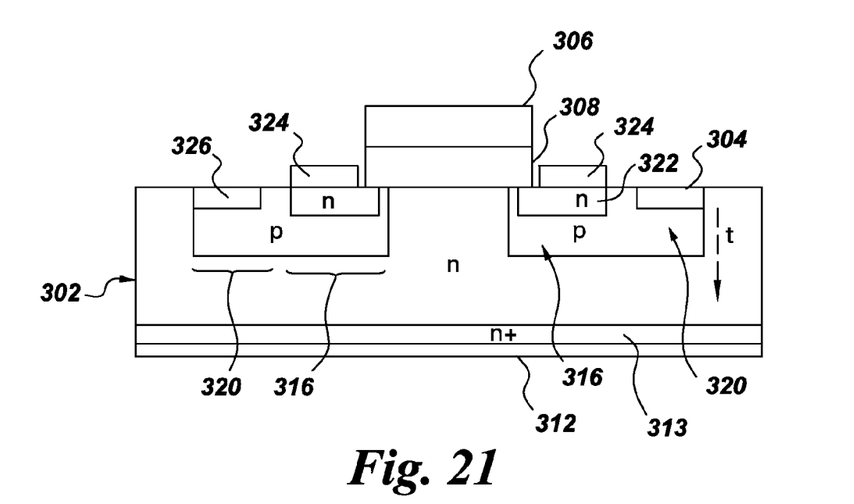

A gate electrode 306 can also be formed so as to be supported by the surface 304 of the substrate 302. For example, an insulation layer 308 can be formed on the surface 304, and the gate electrode 306 can be formed on the insulation layer (FIG. 21). Where the substrate 302 includes silicon carbide, the insulation layer may be silicon dioxide that may be grown by annealing the substrate in an oxygen-rich or water-rich environment.

While only certain features of the invention have been illustrated and described herein, many modifications and changes will occur to those skilled in the art. For example, while the above description discussed forming the adjust region (FIG. 17, 326) by photolithography and ion implantation, in another embodiment, ion implantation may be carried out without any special masking or photolithography. Instead, ion implantation may be applied indiscriminately across the surface of the device at issue (or across the wafer from which the device is made). It is, therefore, to be understood that the appended claims are intended to cover all such modifications and changes as fall within the true spirit of the invention.

What is claimed:

1. A device comprising:
    a gate electrode; and
    a substrate including semiconductor material and having a surface that supports said gate electrode and defines a surface normal direction, said substrate including
        a drift region including a first dopant type so as to have a first conductivity type;
        a well region adjacent to said drift region and proximal to said surface, said well region including a second dopant type so as to have a second conductivity type, said well region including a channel region disposed proximal to said gate electrode;
        a termination extension region disposed adjacent to said well region and extending away from said gate electrode, said termination extension region having an effective concentration of second dopant type that is generally an effective concentration of second dopant type in said well region; and
        an adjust region disposed adjacent to said surface and between said surface and at least part of said termination extension region, wherein an effective concentration of second dopant type generally decreases when moving from said termination extension region into said adjust region along the surface normal direction.

2. The device of claim 1, wherein said termination extension region includes a plurality of discrete regions having said second conductivity type.

3. The device of claim 1, further comprising an insulation layer between said gate electrode and said substrate.

4. The device of claim 1, wherein said termination extension region substantially surrounds said adjust region.

5. The device of claim 1, wherein said substrate further comprises a contact region that has said first conductivity type, said well region being disposed adjacent to said contact region such that said channel region and said termination extension region are disposed on opposing sides of said contact region.

6. The device of claim 5, further comprising a source electrode in contact with said contact region and a drain electrode in contact with a second surface of said substrate.

7. The device of claim 1, wherein said termination extension region is transversely adjacent to said well region.

8. The device of claim 7, wherein said adjust region is proximal to a transverse edge of said termination extension region.

9. A method comprising:
    providing a substrate including semiconductor material doped with a first dopant type to have a first conductivity type, the substrate having a surface that defines a surface normal direction;
    doping the substrate with a second dopant type to form a well region proximal to the surface and having a second conductivity type;
    doping the substrate to form a termination extension region adjacent to the well region, the termination extension region being doped to have an effective concentration of second dopant type that is generally less than an effective concentration of second dopant type in the well region; and doping the substrate to form an adjust region disposed adjacent to the surface and between the surface and at least part of the termination extension region, wherein an effective concentration of second dopant type generally decreases when moving from the termination extension region into the adjust region along the surface normal direction.

10. The method of claim 9, wherein said doping the substrate to form a termination extension region includes doping a termination-adjust region of the substrate, and wherein said doping the substrate to form an adjust region includes doping part of the termination-adjust region to form therein the adjust region.

11. The method of claim 9, further comprising forming a gate electrode so as to be supported by the surface, such that the well region extends proximal to the gate electrode and the termination extension region extends away from the gate electrode.

12. The method of claim 9, wherein said doping the substrate to form a termination extension region includes doping a plurality of discrete regions of the substrate to form a termination extension region.

13. The method of claim 9, further comprising forming an insulation layer on the substrate, and wherein said forming a gate electrode includes forming a gate electrode on the insulation layer.

14. The method of claim 9, further comprising doping the substrate to form a contact region that has the first conductivity type and is disposed adjacent to the well region.

15. The method of claim 14, further comprising:
forming a source electrode in contact with the contact region; and
forming a drain electrode in contact with a second surface of the substrate.

16. The method of claim 9, wherein said doping the substrate to form a termination extension region includes doping the substrate to form a termination extension region that is transversely adjacent to the well region.

17. The method of claim 16, wherein said doping the substrate to form an adjust region includes doping the substrate to form an adjust region that is proximal to a transverse edge of the termination extension region.

18. The method of claim 9, wherein said doping the substrate to form a well region includes doping a well-termination region of the substrate, and wherein said doping the substrate to form a termination extension region includes doping part of the well-termination region to form therein the termination extension region.

19. The method of claim 9, wherein said doping the substrate to form an adjust region includes doping the substrate with the first dopant type to form an adjust region.

20. A device fabricated according to a method comprising:
providing a substrate including semiconductor material doped with a first dopant type to have a first conductivity type, the substrate having a surface that defines a surface normal direction;
doping the substrate with a second dopant type to form a well region proximal to the surface and having a second conductivity type;
doping the substrate to form a termination extension region adjacent to the well region, the termination extension region being doped to have an effective concentration of second dopant type that is generally less than an effective concentration of second dopant type in the well region; and
doping the substrate to form an adjust region disposed adjacent to the surface and between the surface and at least part of the termination extension region, wherein an effective concentration of second dopant type generally decreases when moving from the termination extension region into the adjust region along the surface normal direction.

* * * * *